United States Patent
Kub et al.

(10) Patent No.: US 6,448,909 B1
(45) Date of Patent: Sep. 10, 2002

(54) ANALOG CONTINUOUS WAVELET TRANSFORM CIRCUIT

(75) Inventors: Francis J. Kub, Arnold; Eric D. Justh, Rockville, both of MD (US)

(73) Assignee: The United States of America as represented by the Secretary of the Navy, Washington, DC (US)

( * ) Notice: Subject to any disclaimer, the term of this patent is extended or adjusted under 35 U.S.C. 154(b) by 38 days.

(21) Appl. No.: 09/756,105

(22) Filed: Jan. 8, 2001

Related U.S. Application Data

(60) Provisional application No. 60/178,836, filed on Jan. 28, 2000.

(51) Int. Cl.$^7$ ................................................. H03M 7/00
(52) U.S. Cl. ............................ 341/50; 341/51; 704/205
(58) Field of Search .......................... 704/205; 375/321, 375/316, 322, 345, 350, 326; 455/313; 705/197, 201; 341/50, 51

(56) References Cited

U.S. PATENT DOCUMENTS

| | | | |
|---|---|---|---|
| 4,449,209 A | 5/1984 | Zehner et al. | |
| 4,974,187 A | 11/1990 | Lawton | |
| 5,124,930 A | 6/1992 | Nicolas et al. | |
| 5,396,237 A | * 3/1995 | Ohta | 341/50 |
| 5,495,554 A | 2/1996 | Edwards et al. | |
| 5,581,215 A | * 12/1996 | Ogasawara | 331/45 |
| 5,990,823 A | 11/1999 | Peele et al. | |
| 6,246,345 B1 | * 6/2001 | Davidson et al. | 341/51 |
| 6,281,814 B1 | * 8/2001 | Sasaoka et al. | 341/50 |

* cited by examiner

Primary Examiner—Peguy JeanPierre
Assistant Examiner—Jean Bruner JeanGlaude
(74) Attorney, Agent, or Firm—John J. Karasek; John Gladestone Mills, III

(57) ABSTRACT

An analog continuous wavelet transform circuit is implemented using a bank of quadrature voltage controlled oscillators (VCOs) and a bank of synchronous receivers. The synchronous receivers act as a bandpass filter bank, the center frequency of each synchronous receiver bandpass filter being set by the frequency of a corresponding VCO. Each quadrature VCO generates differential in-phase. (I) and quadrature (Q) outputs, and has a multiplier, gain amplifier/low-pass filter, and a squarer for both I and Q phases, and the squarer outputs are summed to produce the synchronous receiver output. Each synchronous receiver output represents the instantaneous input signal power within a specific bandpass filter bandwidth filter. The center frequency of the bandpass filter is determined by the VCO frequency, and the bandpass filter bandwidth is set by the synchronous receiver low-pass filter bandwidth.

22 Claims, 6 Drawing Sheets

ANALOG CONTINUOUS WAVELET TRANSFORM CIRCUIT

RELATED APPLICATIONS

The present application is based on and claims priority from Provisional Application Serial No. 60/178,836 filed on Jan. 28, 2000.

BACKGROUND OF THE INVENTION

1. Technical Field of the Invention

This invention relates generally to an analog circuit, and more particularly, to an analog circuit approach to implement a continuous wavelet transform circuit to decompose an input signal using a wavelet basis to produce a time-frequency description of the input signal.

2. Description of the Related Art

Decomposition of a signal into components with respect to frequency and time was studied in the past. Prior works were related to the orthogonal decomposition of a signal where time and frequency were unrelated to one another. This decomposition is called as "wavelet transform" which is dependent both on frequency and time.

Various analog and switched-capacitor continuous wavelet transform circuits have been proposed for audio frequency operation. High frequency continuous wavelet transform circuits have potential applications in radar and communications signals processing. Radar applications for wavelet decomposition include chirp detection and matched filtering since radar returns are attenuated, delayed, and dilated versions of transmitted radar pulses.

U.S. Pat. No. 4,974,187 to Lawton discloses a system that decomposes a digital input sequence into its digital wavelet transform. The digital sampling of an analog input to form the digital input sequence loses some of the information of the input signal.

U.S. Pat. No. 5,495,554 to Edwards et al. discloses an analog wavelet transform circuitry for implementing a continuous wavelet transform by forming a multiplicity of analog wavelet outputs. The method comprises filtering an input signal to produce a multiplicity of analog wavelet outputs; sampling the multiplicity of analog wavelet outputs to produce digitally sampled wavelet data; and compressing the digitally sampled wavelet data into a reduced amount of digital data.

Also, wavelet transforms have been suggested in the prior art for use in data compression wherein signal information is arranged in a fashion that would facilitate data compression. Thus, wavelet transforms have many applications in signal processing and image processing. Usually, wavelet transforms are used on discrete-time digital data. However, for certain applications, the wavelet decomposition cannot be performed in real-time using conventional sampled-data and digital techniques. The prior art references fail to teach or suggest an analog continuous wavelet transform circuit which provides a real-time wavelet decomposition at high sampling frequencies. Furthermore, none of the prior art references teach or suggest an analog wavelet transform circuit wherein increasing the number of channels (i.e., the size of the filter bank) does not increase the time required to perform the wavelet decomposition.

Thus, there is a need for an analog continuous wavelet transform circuit which provides a real-time wavelet decomposition at high sampling frequencies. There is also a further need for an analog continuous wavelet transform circuit wherein increasing the number of channels (i.e., the size of the filter bank) does not increase the time required to perform the wavelet decomposition. The system and method of the present invention offers an effective solution overcoming the problems encountered by the prior art.

SUMMARY OF THE INVENTION

Accordingly, the present invention is directed to an analog continuous wavelet transform circuit and method for decomposing an input signal using a wavelet basis to produce a time-frequency description of the input signal.

In one aspect, the present invention is directed to an analog continuous wavelet transform apparatus which comprises a plurality of quadrature voltage controlled oscillators (VCOs) for generating center frequencies of a plurality of synchronous receivers, wherein each quadrature VCO generates differential in-phase (I) and quadrature (Q) outputs. The plurality of synchronous receivers act as a bandpass filter bank which comprises a plurality of bandpass filters. The center frequency of each of the plurality of bandpass filters is set by the frequency of a corresponding voltage controlled oscillator, and bandwidth of each of the bandpass filters is set by bandwidth of a lowpass filter of a corresponding synchronous receiver. The bandwidths of each of the bandpass filters is chosen in such a manner so as to make the overall power response of the bank of bandpass filters uniform over the frequency range of the bandpass filter bank.

Each of the synchronous receivers of the analog continuous wavelet transform apparatus further comprises at least one multiplier, at least one gain amplifier, and at least one squarer for both in-phase (I) and quadrature (Q) phase to produce a squarer output, and means for combining the squarer outputs to produce a synchronous receiver output. Gilbert multipliers may be used to perform the multiplication and squaring functions. The wavelet transform apparatus further includes a circuit to remove the offset of the gain amplifier. The output of each of the synchronous receivers represents the instantaneous input signal power within a specific bandpass filter. Each of the bandpass filters may act as a channelized receiver. Each squarer further comprises at least one adder circuit, and an analog compressing circuit implemented within the adder circuit in order to increase the dynamic range of the wavelet transform apparatus.

The order of each of the bandpass filters is determined by the order of a corresponding synchronous, receiver. Resistive dividers may be used to bias the intermediate VCOs among the plurality of the VCOs. The endpoints of the resistor dividers may be biased using fixed voltages or by using phase locked loops (PLLs) having fixed frequency reference as inputs. The voltages to the resistor voltage dividers are controlled by applying programmable voltages. The wavelet transform apparatus further includes analog-to-digital converters for converting the analog output to a digital output for each of the bandpass filters. An analog multiplexer may be used for multiplexing a plurality of parallel bandpass filter outputs to a single analog-to-digital converter. The wavelet transform apparatus further comprises a plurality of frequency synthesizers to generate the center frequencies of the plurality of synchronous receivers. The plurality of frequency synthesizers are implemented with at least one of PLL architecture, fractional-N PLL architecture, or direct digital synthesizer (DDS) architecture.

In another aspect, the present invention is directed to a method for performing time-frequency decomposition of a high frequency input signal using a wavelet basis, comprising generating differential in-phase (I) and quadrature (Q)

outputs by a plurality of quadrature voltage: controlled oscillators (VCOs). The high frequency input signal is filtered by means of a plurality of synchronous receivers acting as a bandpass filter bank. Each of the synchronous receivers act as a bandpass filter, and the center frequency of each of the synchronous receivers is set by a frequency of a corresponding voltage controlled oscillator (VCO). An output is produced at each of the synchronous detectors wherein each of the outputs represents an instantaneous input signal power within a corresponding bandpass filter.

In another exemplary embodiment, the high frequency input signal is a one-dimensional time signal having a time-varying voltage. The bandpass filter bank measures the energy of the input signal within an overlapping bank of bandpass filters. Further, the simultaneous sampling of outputs of each of the bandpass filters is performed using sample-and-hold circuits.

Still other objects and advantages of the present invention will become apparent to those skilled in the art from the following detailed description, wherein only the preferred embodiment of the invention is shown and described, simply by way of illustration of the best mode contemplated of carrying out the invention. As will be realized, the invention is capable of different embodiments, and its several details are capable of modifications in various obvious respects, all without departing from the invention. Accordingly, the drawings and description are to be regarded as illustrative in nature, and not as restrictive.

DESCRIPTION OF THE PREFERRED EMBODIMENT

A more complete understanding of the present invention may be had by reference to the following Detailed Description when taken in conjunction with the accompanying drawings wherein.

DETAILED DESCRIPTION OF THE DRAWINGS

Figure 1:
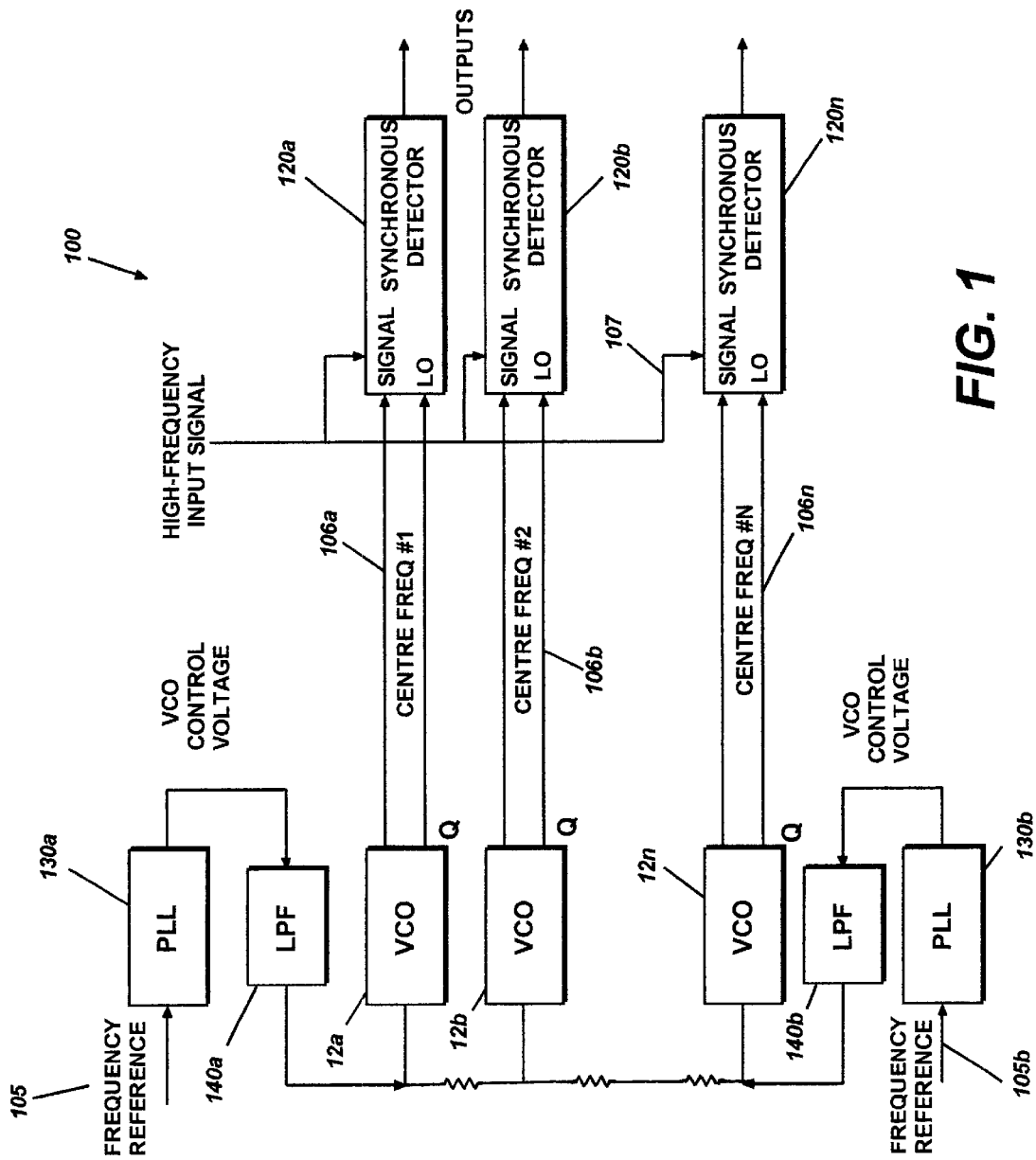
FIG. 1 illustrates an overview of the continuous wavelet transform circuit of the present invention.

In the drawings, like or similar elements are designated with identical reference numerals throughout the drawings, and the various elements depicted are not necessarily drawn to scale. Referring now to FIG. 1, there is shown a general overview of the continuous wavelet transform circuit of the present invention implemented using a bank of quadrature voltage controlled oscillators (VCOs) or frequency synthesizers 12a–12n, and bank of synchronous detectors 120a–120n. The synchronous detectors 120a–120n may act as a channelized receiver, or bandpass filter bank. Each quadrature voltage controlled oscillator (VCO), which may be a four stage ring oscillator, generates differential in-phase (I) and quadrature (Q) outputs.

Figure 2:
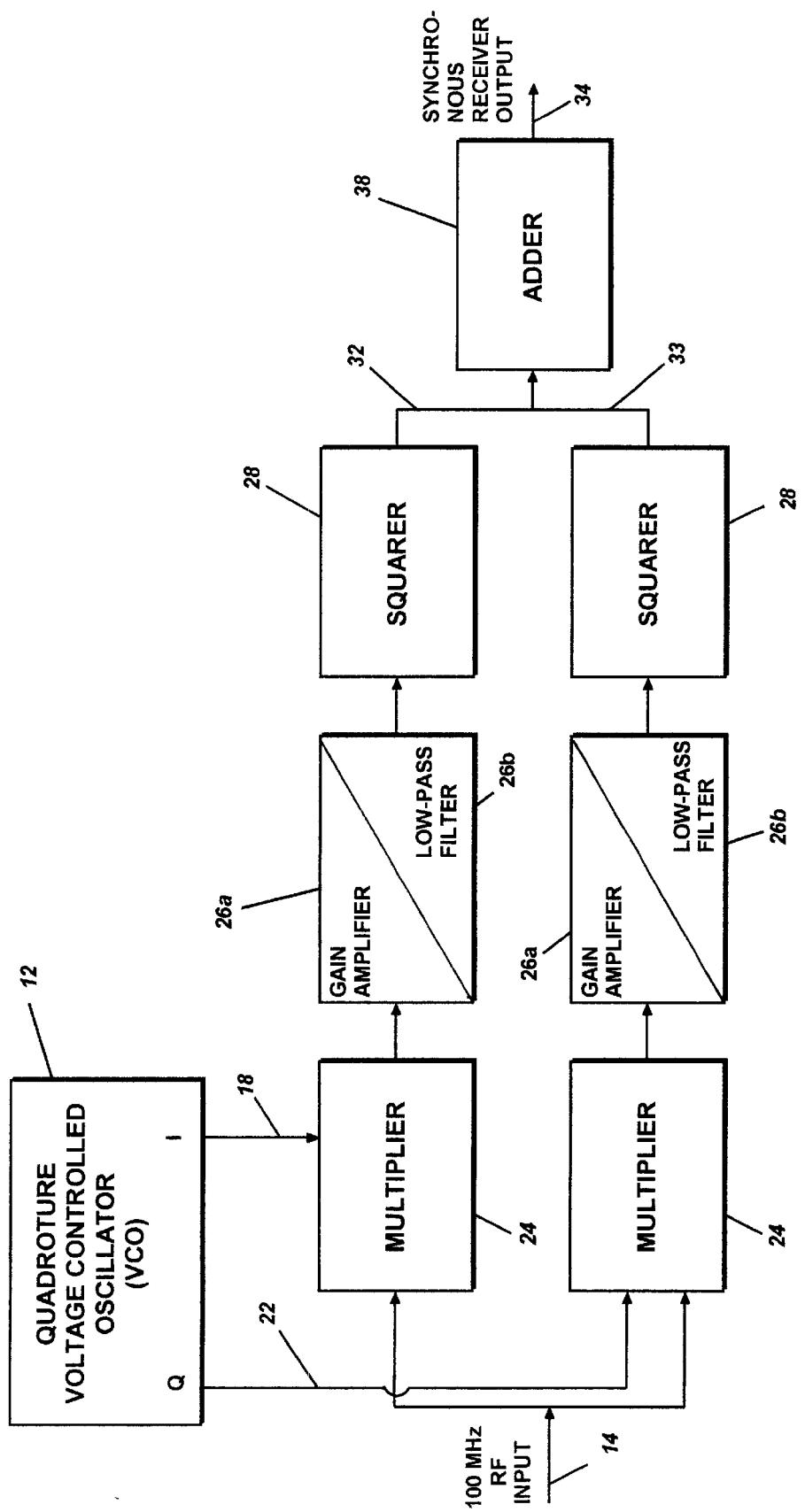
FIG. 2 illustrates the synchronous detector block diagram of the present invention.

Against the above description of FIG. 1, description of FIG. 2 may be better understood. FIG. 2 discloses a synchronous detector block diagram of the present invention. A bank of synchronous receivers (not shown) act as a bandpass filter bank, the center frequency of each synchronous receiver is set by the frequency of a corresponding voltage controlled oscillator. Each VCO 12a–12n (referred to hereinafter as "12" for simplicity) generate differential in-phase (I) and quadrature (Q) outputs 18 and 22, respectively, and has a multiplier 24, gain amplifier/low pass filter 26a and 26b, respectively. Each VCO further includes a squarer 28 for both in-phase (I) 18 and quadrature (Q) 22 phases, and the squarer outputs 32 and 33 are summed in an adder 38 to produce a synchronous receiver output 34. It may also be possible to take the outputs of low-pass filter 26b as the wavelet decomposition. Reconstruction could then in principle be performed by multiplying these baseband signals by the corresponding quadrature VCO signals and then summing the resulting high frequency signals together.

Each synchronous receiver output 34 represents the instantaneous input signal power within a specific bandpass filter. The center frequency of the bandpass filter is determined by the frequency of the VCOs 12, and the bandpass filter bandwidth is set by the bandwidth of the synchronous receiver low-pass filter 26b. A circuit may be used to remove the offset of the gain amplifier 26a. Wide-range Gilbert multipliers may be used to perform the multiplication and squaring functions. The frequency control voltage of the VCOs 12 are biased to produce a sequence of appropriately spaced frequencies. For the continuous wavelet transform circuit 100, the center frequencies are geometrically related, i.e., $f_{i+1}=\acute{a}f_i$, where $f_i$ and $f_{i+1}$ are successive VCO frequencies and $\acute{a}>1$ is the dilation constant. For simplicity, equally spaced frequencies are used in this invention.

The widths of the bandpass filters are also varied in a geometrically related manner. For the bank of bandpass filters (or channelized receiver), equally-spaced frequencies are used. For instance, the bandwidth of the synchronous receiver low-pass filter is approximately equal to the frequency spacing of VCO 12. Instead of separately biasing each VCO 12, resistor voltage dividers may be used to bias intermediate VCO 12 inputs. The endpoints of the resistor divider may be biased using fixed voltages, or by using phase-locked loops (with fixed frequency as inputs) which provide appropriate voltage references. Alternately, the voltages to the resistor dividers (not shown) may be controlled by applying programmable voltages.

The bandwidths of the bandpass filters are chosen so that the overall power response of the bank of bandpass filters is uniform over the frequency range of the filter bank (for example, the 3 dB bandwidth of the synchronous receiver low-pass filter 26b is approximately equal to the VCO 12 frequency spacing). Whether a wavelet transform or a bank of bandpass filters (or channelized receiver) is implemented depends on whether the capacitor values in the synchronous receiver low-pass filters 26b are scaled.

Figure 3:
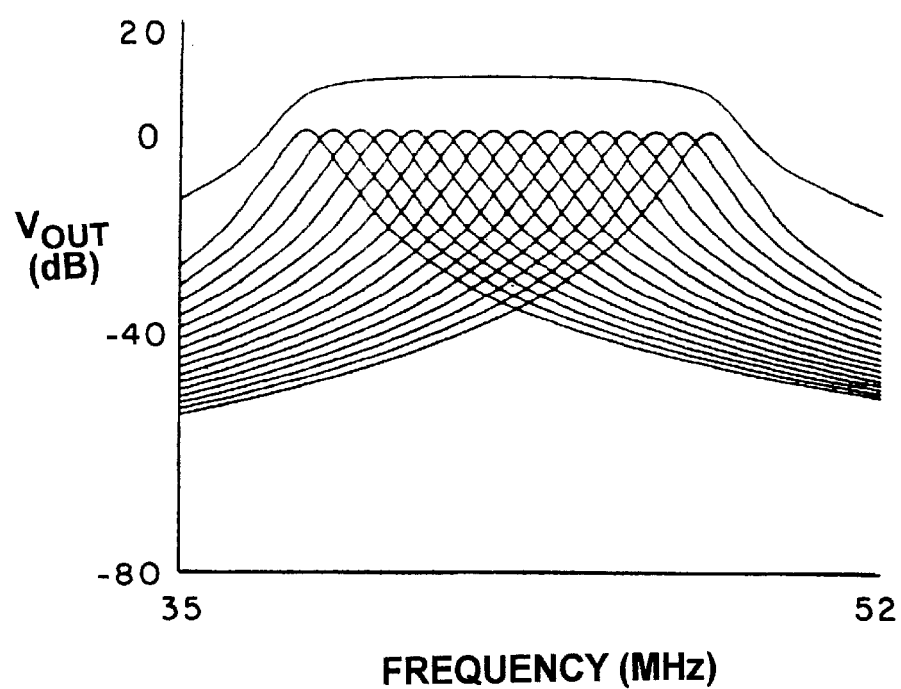
FIG. 3 is a graph depicting the frequency response for a single-pole low pass filter in the synchronous receiver circuit.
Figure 4:
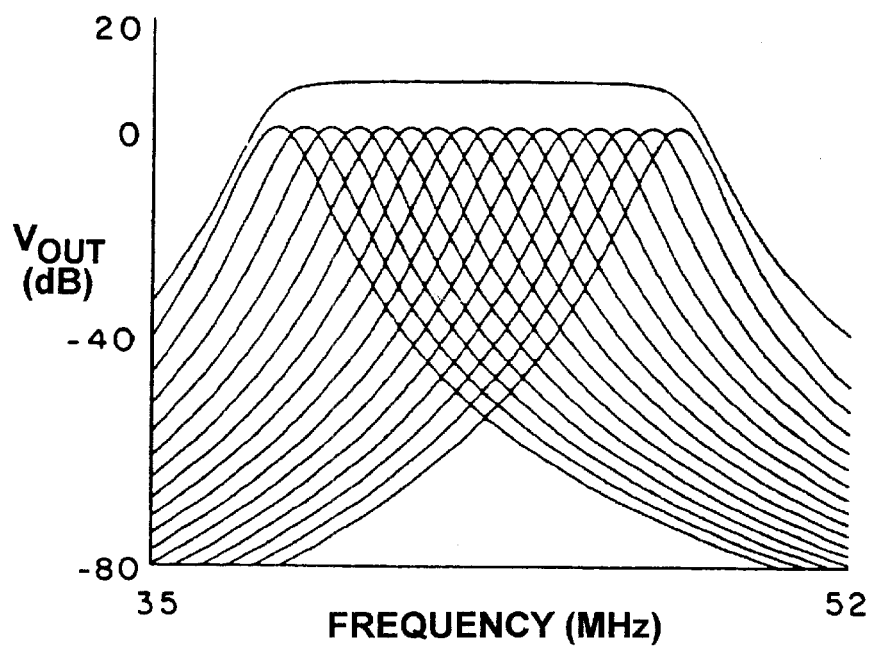
FIG. 4 is a graph depicting the frequency response for a two-pole low pass filter in the synchronous receiver circuit.

An approach to increase the dynamic range of the analog continuous wavelet transform circuit 100 is to implement an analog compression circuit either within (or following) the adder circuit 38 for the squared in-phase and squared quadrature phase signals 32 and 33, respectively. The order of the low-pass filter 26b in the synchronous receiver determines the bandpass filter characteristic. The order of the bandpass filter is determined by the order of the synchronous receiver low-pass filter 26b which would typically be a first-order filter resulting in a second order bandpass filter. Likewise, a second order low-pass filter would result in a fourth order bandpass filter. A single-pole low-pass filter design may easily be converted to a two-pole filter design by adding a capacitor across the differential outputs of the multipliers 24 that drive the low-pass filters 26b. The two-pole low-pass filter design has much steeper skirts, and hence better separation of signals with different frequencies. FIGS. 3 and 4 show a graph depicting the frequency response for a single-pole low pass and two-pole low-pass filter in the synchronous receiver circuit, respectively.

Since increasing the number of channels can be used to increase system performance, size and power dissipation constraints play an important role in the design for the continuous wavelet transform apparatus. For instance, for a 2 micron design, the channels were laid out on a 150 micron pitch with under 100 mW power dissipation per channel and a maximum operating frequency of 50 MHz. For a 0.5 micron design, the channels were laid out on a 56 micron pitch with under 40 mW power dissipation per channel and a maximum operating frequency in excess of 100 MHz. The total size of a 16-channel 2 micron chip was 4750 microns by 3100 microns.

Figure 7:
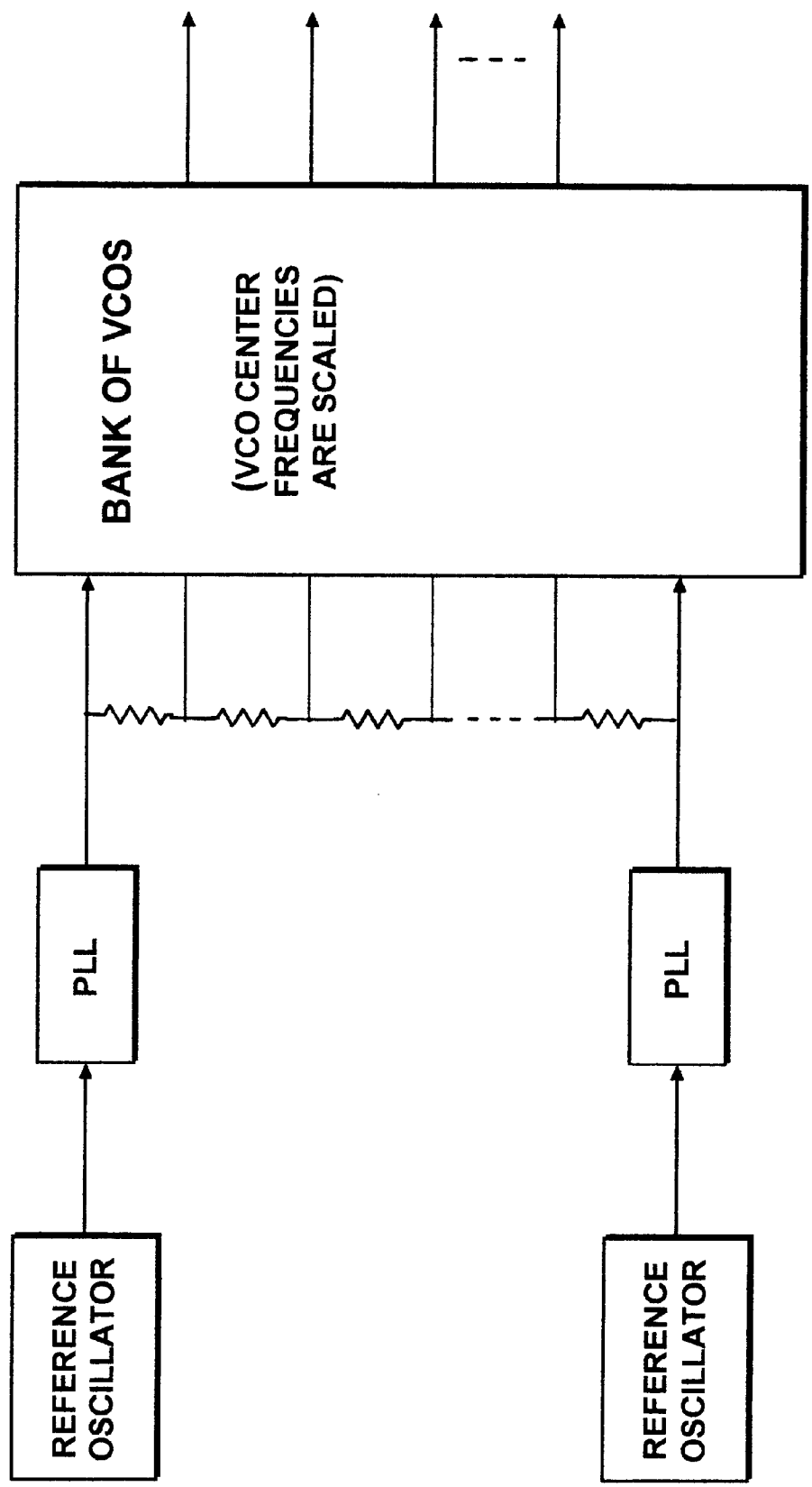
FIG. 7 is a schematic of a bank of frequency generators controlled by replica phase locked loops.

The design of the VCO is particularly critical since the VCO should have a constant, frequency-independent output voltage, and also should be tunable over as large frequency range as possible. For the present invention, Diodes may be used to set the output amplitude, triode MOSFET resistors to change the oscillation frequency, and bias current adjustment slaved to the triode resistor setting to compensate for the change in loop gain associated with changing the triode resistor values. To prevent drifts in the frequencies of VCO 12 with changes in temperature, phase-locked loops (PLLs) 130a and 130b and external frequency references 105a and 105b may be used as illustrated in FIG. 1. Where the VCO voltage-frequency characteristic is linear, many VCOs can be biased using a pair of PLLs along with a resistive voltage divider (with equal value resistors to achieve equally spaced frequencies) as shown in FIG. 7 of the present invention.

In another embodiment of the present invention, analog-to-digital converters (ADCs) may be used to convert the analog output of each of the synchronous bandpass filter bank to digital data. An analog multiplexer is used to multiplex a number of parallel bandpass filter outputs to a single ADC. For instance, eight of sixteen bandpass filter outputs may be multiplexed to a single ADC. A conventional sample-and-hold circuit may be provided at the output of each of the synchronous receivers filter to allow simultaneous sampling of the bandpass filter results.

As described above, a bank of VCOs 12a–12n are used to generate the center frequencies of the synchronous receivers 120a–120n. An alternative approach would be to use a bank of frequency synthesizers to generate the center frequencies of the synchronous receiver bandpass filters. A bank of coherent frequency synthesizers may also be used to generate the center frequencies of the synchronous receiver bandpass filters. For multicarrier systems there may be some added benefits if the bank of frequency synthesizers are coherent with programmable control of the phase of each frequency synthesizer. The frequency synthesizers may also be implemented with at least one of a PLL architecture, fractional-N PLL architecture, direct digital synthesizer (DDS) architecture. A bank of fractional-N synthesizers may also be used if feasible. To implement a receiver for complex modulations, the in-phase (I) and quadrature (Q) phases may be converted to digital data directly using an ADC on I and Q phase outputs.

In order to increase the data transmission rates, multicarrier communication systems, which resemble the bandpass filter bank circuit, at the receiver end may be used, wherein each of the bank of receivers at the receiving end correspond to one of the carrier frequencies. The analog continuous wavelet transform circuit 100 allows real-time frequency analysis of the radio-frequency (RF) environment. The advantage of a fully integrated approach is that a larger number of channels can be fully integrated on a single chip with low power dissipation. Typical applications for the continuous wavelet transform apparatus include RF spectrum identification and analysis, modulation analysis, Radar signal analysis, and systems requiring increased communication data rates.

Figure 5:
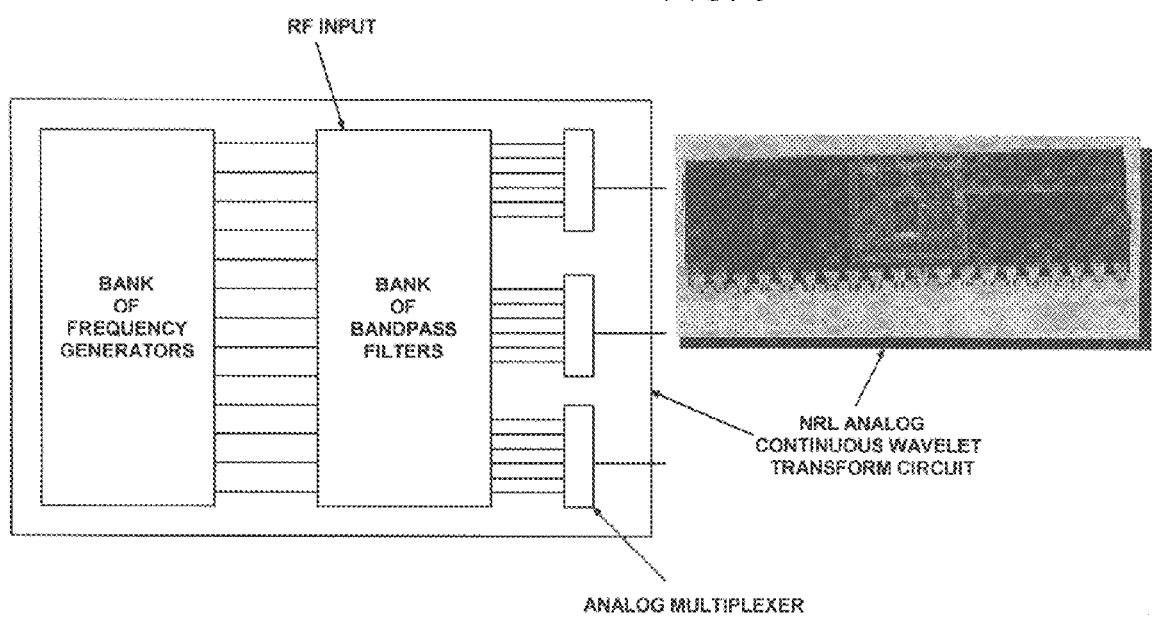
FIG. 5 illustrates a VLSI implementation of the continuous wavelet transform apparatus.
Figure 6:
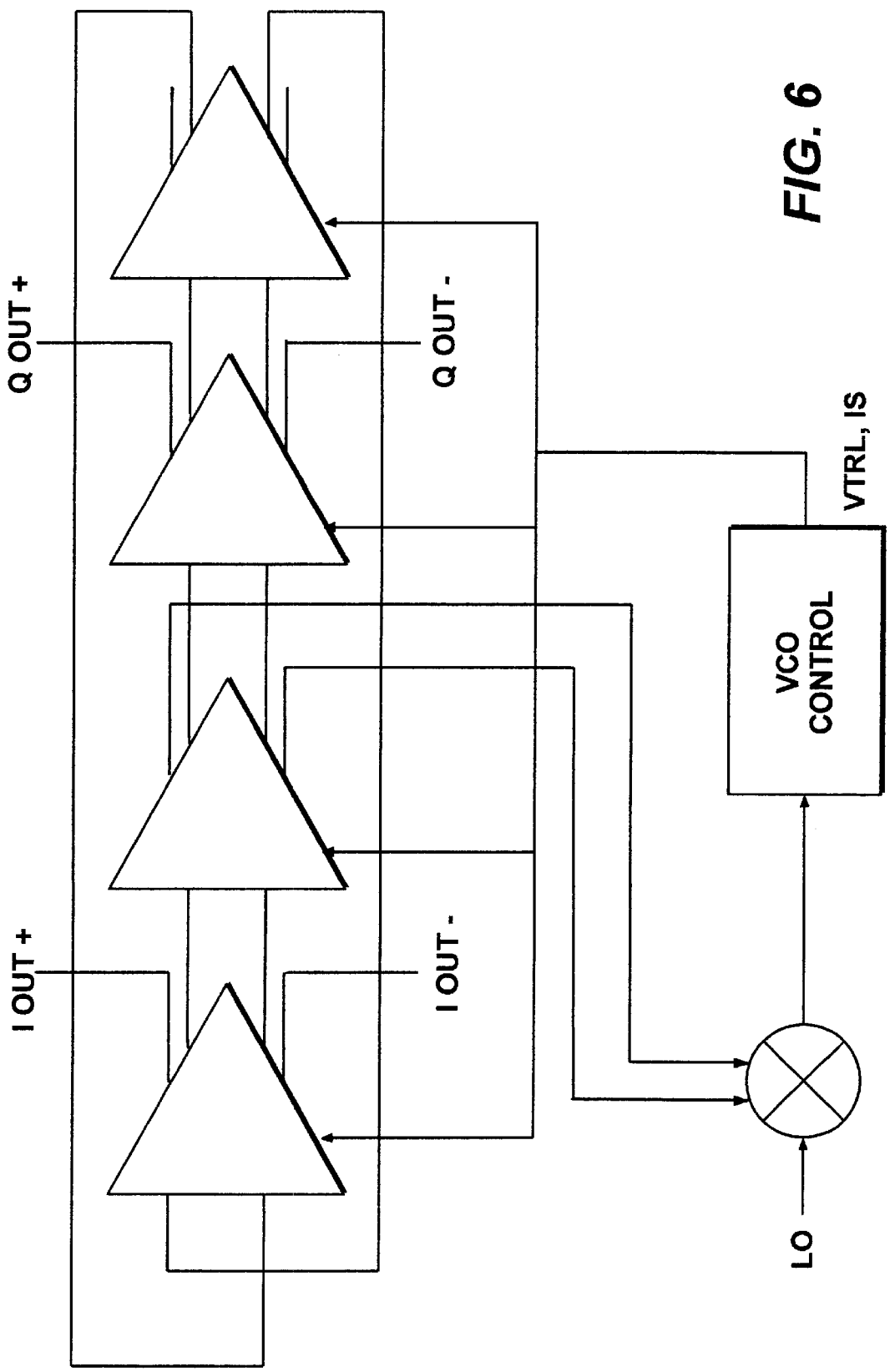
FIG. 6 is a schematic of a phase locked loop with quadrature voltage controlled oscillator.

FIG. 5 illustrates a VLSI implementation of the continuous wavelet transform apparatus of the present invention as illustrated in FIG. 1. FIG. 6 is a schematic of a phase locked loop with quadrature voltage controlled oscillator.

It is believed that the operation and construction of the present invention will be apparent from the foregoing Detailed Description. While the apparatus and method shown and described have been characterized as being preferred, it should be readily understood that various changes, modification and enhancements could be made therein without departing from the scope of the present invention as set forth in the following claims. For example, it is possible to change the characteristics and design of the VCOs, synchronous receivers, and various other components may be added of deleted from the disclosed circuit of the present invention, without departing from the core concept. It is further possible to use a variety of filer functions. Accordingly, those skilled in the art should readily appreciate that these and other variations, additions, modifications, enhancements, et cetera, are deemed to be within the ambit of the present invention whose scope is determined solely by the following claims.

What is claimed is:

1. An analog continuous wavelet transform apparatus, comprising:
    a plurality of quadrature voltage oscillators (VCOs) for generating center frequencies of a plurality of synchronous receivers;
    said plurality of synchronous receivers acting as a bandpass filter bank said bank comprising a plurality of bandpass filters, wherein center frequency of each of said plurality of bandpass filters is set by the frequency of a corresponding voltage controlled oscillator, and bandwidth of each of said bandpass filters is set by bandwidth of a lowpass filter of a corresponding synchronous receiver; and
    bandwidths of each of said bandpass filters is chosen whereby the overall power response of said bank of bandpass filters is uniform over the frequency range of said bandpass filter bank.

2. The apparatus of claim 1, wherein each of said synchronous receiver further comprises:
    at least one multiplier;
    at least one gain amplifier;
    at least one squarer for acting on both in-phase (I) and quadrature (Q) phases to produce a squarer output; and
    means for combining said squarer output to produce a synchronous receiver output.

3. The apparatus of claim 2, wherein said multiplier is a wide-range Gilbert multiplier.

4. The apparatus of claim 2, wherein said squarer further comprises at least one adder circuit, and an analog compressing circuit implemented within said adder circuit to increase the dynamic range of said wavelet transform apparatus.

5. The apparatus of claim 2, wherein said squarer further comprises at least one adder circuit, and an analog compressing circuit following said adder circuit to increase the dynamic range of said wavelet transform apparatus.

6. The apparatus of claim 2 further comprises an analog multiplexer for multiplexing a plurality of parallel bandpass filter outputs to a single analog-to-digital converter.

7. The apparatus of claim 2 wherein said lowpass filter is a two-pole low pass filter achieved in said synchronous detector by adding a capacitor to a first multiplier.

8. The apparatus of claim 1, wherein each of said bandpass filters is a channelized receiver.

9. The apparatus of claim 1, wherein the order of each of said bandpass filters is determined by the order of a corresponding synchronous receiver.

10. The apparatus of claim 1 further comprises resistive dividers to bias the intermediate VCOs among said plurality of VCOs.

11. The apparatus of claim 10, wherein endpoints of said resistor dividers are biased using fixed voltages.

12. The apparatus of claim 10, wherein end points of said resistor dividers are biased using phase locked loops (PLL) having fixed frequency reference as inputs.

13. The apparatus of claim 10, wherein voltages to the resistor voltage dividers are controlled by applying programmable voltages.

14. The apparatus of claim 1 further comprises analog-to-digital converters for converting the analog output to a digital output of each of the bandpass filters.

15. The apparatus of claim 1 further comprises a plurality of frequency synthesizers to generate the center frequencies of said plurality of synchronous receivers.

16. The apparatus of claim 15, wherein said plurality of frequency synthesizers are implemented with at least one of phase lock loop (PLL) architecture, fractional-N PLL architecture, or direct digital synthesizer (DDS) architecture.

17. The apparatus of claim 1 further comprises a circuit to remove an offset of said gain amplifier.

18. The apparatus of claim 17, wherein the output of each of said synchronous receivers represents the instantaneous input signal power within a specific bandpass filter.

19. A method for performing time-frequency decomposition of a high frequency input signal using a wavelet basis, comprising:

generating differential in-phase (I) and quadrature (Q) outputs by a plurality of quadrature voltage controlled oscillators (VCOs);

filtering said input signal by means of a plurality of synchronous receivers acting as a bandpass filter bank, each of said synchronous receivers acting as a bandpass filter, and wherein the center frequency of each of said synchronous receivers is set by the frequency of a corresponding VCO; and producing an output at each of said synchronous receivers, wherein output of each said synchronous receivers represents the instantaneous input signal power within a corresponding bandpass filter.

20. The method of claim 19, wherein said high frequency input signal is a one-dimensional time signal having a time-varying voltage.

21. The method of claim 19, wherein said bandpass filter bank measures the energy of the input signal within an overlapping bank of bandpass filters.

22. The method of claim 19, wherein simultaneous sampling of outputs of each of said bandpass filters is performed using sample and hold circuits.

* * * * *